United States Patent [19]
Seidler

[11] Patent Number: 5,441,429
[45] Date of Patent: Aug. 15, 1995

[54] SOLDER-BEARING LAND

[75] Inventor: Jack Seidler, Flushing, N.Y.

[73] Assignee: North American Specialties Corporation, Flushing, N.Y.

[21] Appl. No.: 108,930

[22] Filed: Aug. 18, 1993

Related U.S. Application Data

[63] Continuation-in-part of Ser. No. 927,415, filed as PCT/US91/02489, Apr. 11, 1991, Pat. No. 5,344,343, which is a continuation-in-part of Ser. No. 510,004, Apr. 13, 1990, Pat. No. 5,030,144, and a continuation-in-part of Ser. No. 661,252, Feb. 26, 1991, Pat. No. 5,090,926.

[51] Int. Cl.$^6$ .............................................. H01R 4/02
[52] U.S. Cl. ...................................... 439/876; 29/843
[58] Field of Search ................. 439/876, 83; 228/56.3; 29/843

[56] References Cited

U.S. PATENT DOCUMENTS

| | | |
|---|---|---|
| 4,357,069 | 11/1992 | Milora . |
| 4,367,910 | 1/1983 | Seidler ................................. 439/876 |
| 4,605,278 | 8/1986 | Seidler ................................. 439/876 |
| 4,679,889 | 7/1987 | Seidler ................................. 439/876 |
| 4,900,279 | 2/1990 | Dennis ................................. 439/876 |
| 5,015,206 | 5/1991 | Dennis ................................. 439/876 |
| 5,030,144 | 7/1991 | Seidler . |

OTHER PUBLICATIONS

"Clad Metals", Semi Alloys Corp., Tech Bull CM-64, Jul. 1968.

Primary Examiner—Eugene F. Desmond
Attorney, Agent, or Firm—Darby & Darby

[57] ABSTRACT

A solder-bearing lead adapted to be soldered to a conductive surface comprises an elongated body portion having a solder-bearing portion, a terminal portion, and a middle portion disposed between said solder-bearing portion and said terminal portion. The solder-bearing portion carries a solder mass either on a pair of projections extending from one edge of said body portion and forming a gap therebetween dimensioned to receive a solder mass, or on one or both of the opposed faces of said solder-bearing portion. A region of the middle portion is twisted or the projections are bent so that the solder-bearing portion lies in a plane substantially perpendicular to the plane of the terminal portion. The solder-bearing lead can be used as an edge clip for mounting a substrate such as a printed circuit board, or as a surface-mounted lead for a substrate. The lead is arranged to provide, during soldering, direct metal-to-metal contact with the conductive area to which it is to be soldered, to avoid shifting of the parts due to molten solder.

36 Claims, 9 Drawing Sheets

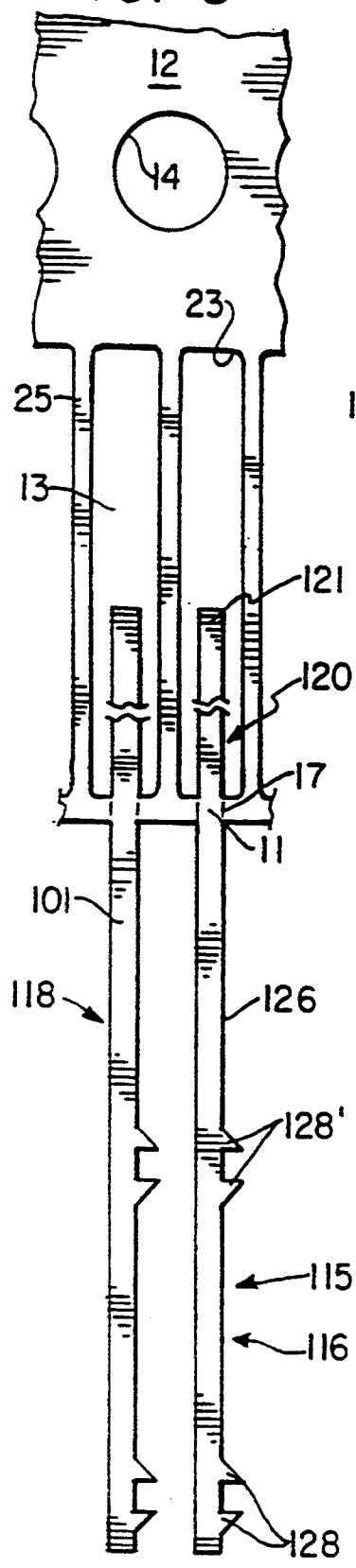
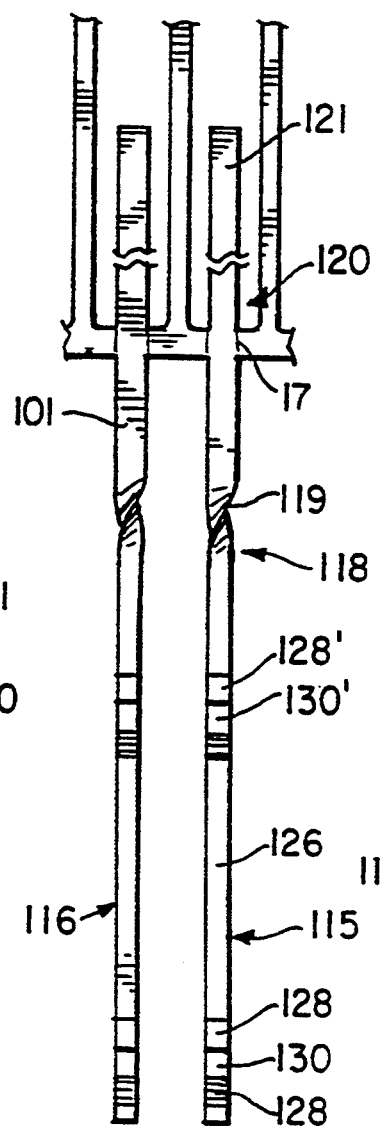
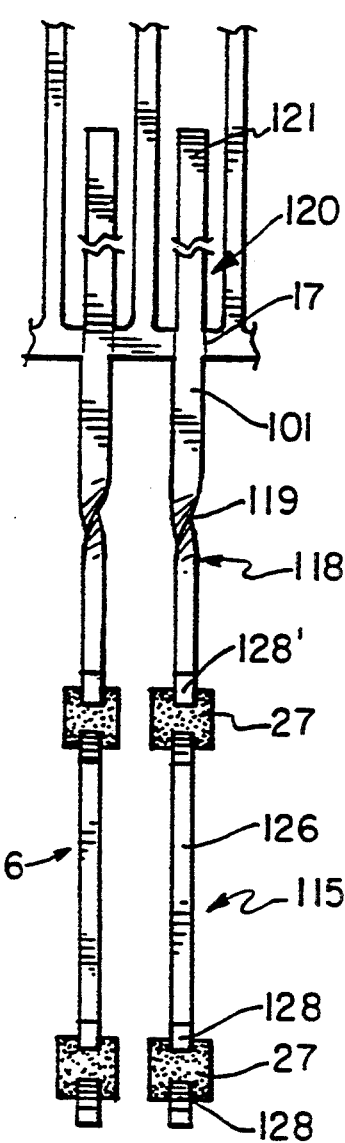
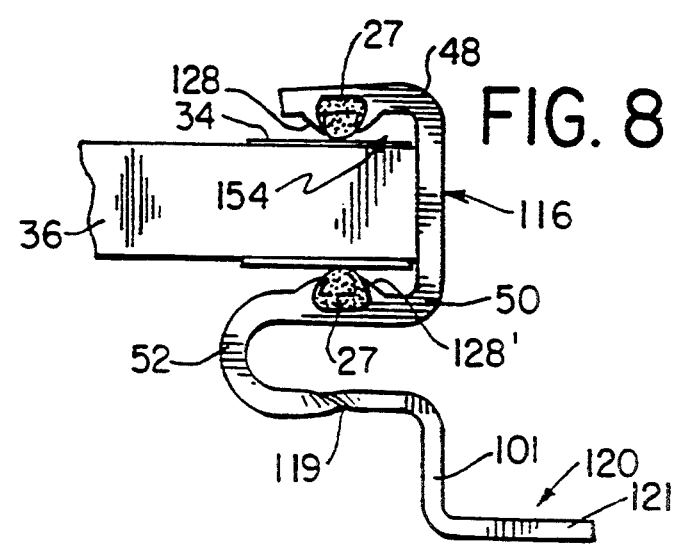

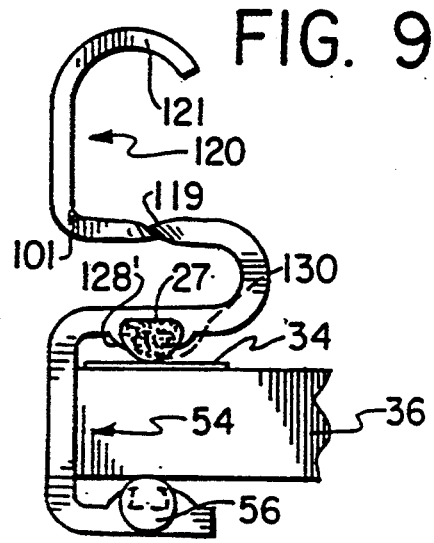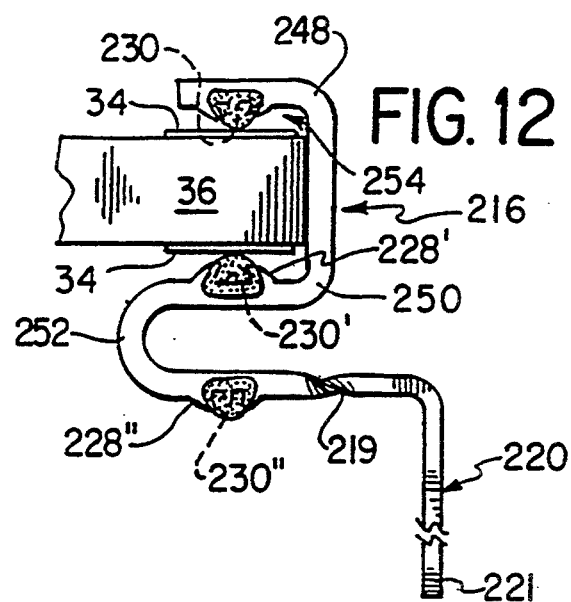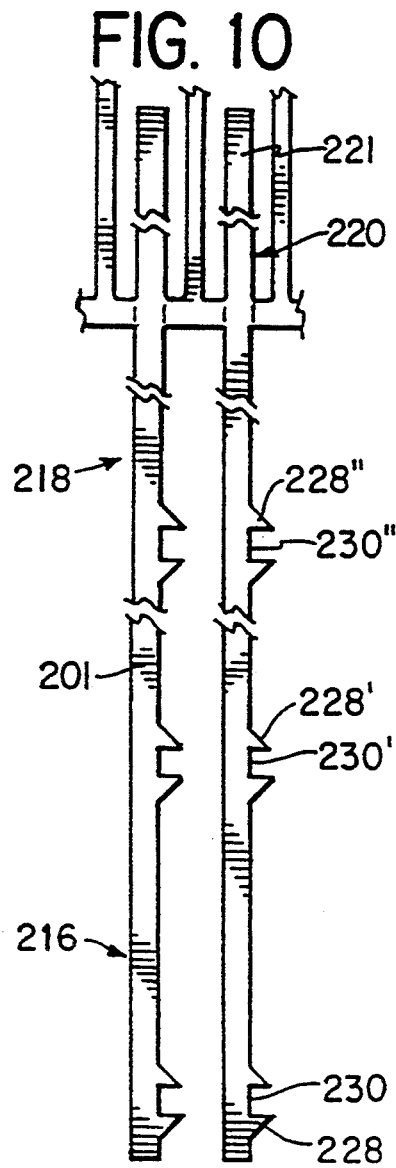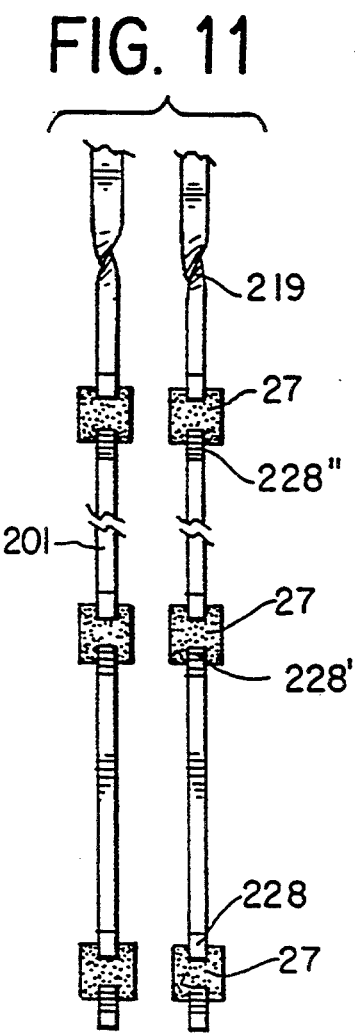

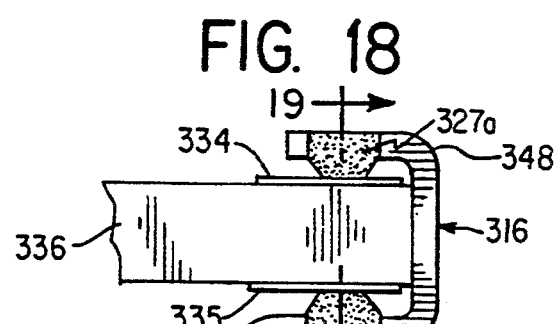
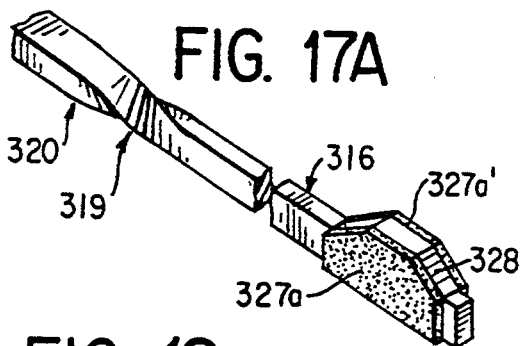
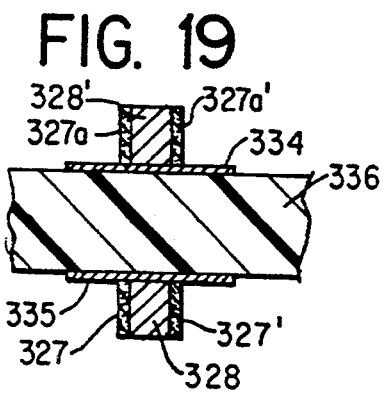
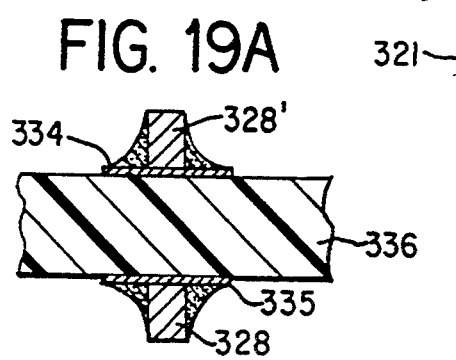

SOLDER-BEARING LAND

The present application is a continuation-in-part of U.S. patent application Ser. No. 07/927,415, filed 21 Sep. 1992, now U.S. Pat. No. 5,344,343, as a U.S. National Phase application of Patent Cooperation Treaty Application No. PCT/US91/02489, filed 11 Apr. 1991, which in turn is a continuation-in-part of both U.S. patent application Ser. No. 510,004, filed 13 Apr. 1990, now U.S. Pat. No. 5,030,144 issued 9 Jul. 1991 and U.S. patent application Ser. No. 661,252, filed 26 Feb. 1991, now U.S. Pat. No. 5,090,926.

BACKGROUND OF THE INVENTION

1. Field of the Invention

This invention relates to solder-bearing contacts and leads for attachment to contact pads on substrates such as electronic circuit boards, chip carriers, or the like.

2. Description of the Related Art

In the electronic equipment industry, it is known to provide leads for connection to contact pads of printed circuit boards and other substrates by soldering the leads thereto. See, e.g. U.S. Pat. Nos. 4,728,305 and 4,597,628. However, as the electronic industry continues to move toward greater miniaturization, the size and spacing between the contact pads has accordingly been reduced. This requires a corresponding reduction in the size and spacing of the leads which are to be connected to contact pads.

However, in attempting to reduce the spacing between leads, it is also important to provide sufficient spacing to prevent inadvertent contact or arcing between adjacent leads.

The objective of size/space reduction of the leads must be achieved without sacrificing accuracy in manufacture of the leads. It is also desirable to provide rapid assembly of multiple leads. Prior construction and manufacturing processes of leads have been unable to achieve effectively the required reduced size and spacing.

Thus, the need exists for effectively applicable leads of reduced size and spacing to accommodate the current reduction in the size and spacing of contact pads of substrates, but sufficiently spaced to prevent arcing. The need also exists for a method of manufacturing such leads without sacrificing accuracy.

In addition, in soldering a lead to a substrate contact pad, it has been common to provide solder between the lead and pad, either held on the lead or placed on the pad. When the solder liquifies, it forms a type of lubricant between the parts to be joined, which may be caused to vary their relative position, so that the parts may be misaligned when the solder solidifies.

SUMMARY OF THE INVENTION

The present invention overcomes the problems and deficiencies of the prior art by providing solder-bearing leads of reduced size and spacing to accommodate current reductions in the size and spacing of contact pads of printed circuit boards, circuit chips, or other substrates. The leads may be formed from a continuous metal strip by progressive stamping. The solder-bearing portion of the lead of the present invention in one form includes a pair of projections extending from one edge to form a gap therebetween which is dimensioned to receive and retain a solder mass. A region of a portion of the lead is twisted so that the edge of the solder-bearing portion containing the projections is bent so that the projections lie in a plane substantially perpendicular to the plane of the remaining portion. Since the thickness of the lead when initially formed is less than its width, the twisting of the solder-bearing portion results in a lesser width of that portion adapted to contact the substrate and permits closer spacing of leads. A solder mass is placed and held within the gap between projections of the solder-bearing portion to provide electrical bonding between the lead and the substrate.

In a modified form, the projections referred to may be dispensed with or modified to eliminate any gap. Instead, the solder is applied as one or more stripes on the continuous strip from which the leads are formed, before stamping and twisting. The solder-bearing portion of the lead after twisting is adapted to be applied to the contact pad with the edge of the lead and its adjoining solder stripe or stripes applied against the contact pad.

The solder-bearing lead can be used inter alia as an edge clip for securing to a substrate or for surface mounting on the substrate. The solder-bearing lead can advantageously be made by automatic progressive stamping of blanks at high speed and simple twisting of the lead. The leads may be readily configured to be formed attached to a carrier strip and for group attachment to a substrate, with provision thereafter to remove the solder-bearing and terminal portions of the lead from the carrier.

In another aspect of the invention, solder is carried by the lead in a manner which permits the lead and the substrate contact pad or other conductive area to which the lead is to be held in metal-to-metal contact during the soldering operation.

BRIEF DESCRIPTION OF THE DRAWINGS

The objects, features, and advantages of the present invention will be more completely disclosed with reference to the following detailed description of presently preferred embodiments of the present invention, taken with the attached drawings, in which:

FIG. 5 shows a plan view of a modified form of the stamped blank for use in making another embodiment of the lead of the present invention;

FIG. 6 shows a plan view of the leads of FIG. 5 each having a twist in accordance with the present invention:

FIG. 7 shows a plan view of the leads of FIG. 6 each retaining two solder masses;

FIG. 8 shows a side view of a lead as in FIG. 7 bent into a configuration to form a clip for a substrate;

FIG. 9 shows a side view of a lead as in FIG. 7 bent into an alternate configuration to form a clip for a substrate;

FIG. 10 shows a plan view of another modified form of stamped blank for use in making yet another embodiment of the lead of the present invention;

FIG. 11 shows a plan view of a portion of the leads of FIG. 10 each having a twist in accordance with the present invention and retaining solder masses;

FIG. 12 shows a side view of a lead as in FIG. 11 bent into a configuration to form a clip for a substrate and for surface mounting to another substrate;

FIG. 17A is a fragmentary perspective view of the end of one lead blank of FIG. 17;

FIG. 18 is a view similar to FIG. 8 showing the relationship of the lead of FIGS. 14 to 17 to a substrate and its contact pads;

FIG. 19 is a fragmentary cross-sectional view of FIG. 18 taken along line 19—19 thereof, showing the lead and its solder stripes assembled to the substrate;

FIG. 19A shows the arrangement of FIG. 19 after heating and resolidification of the solder.

DETAILED DESCRIPTION OF THE PREFERRED EMBODIMENTS

Figure 1A:
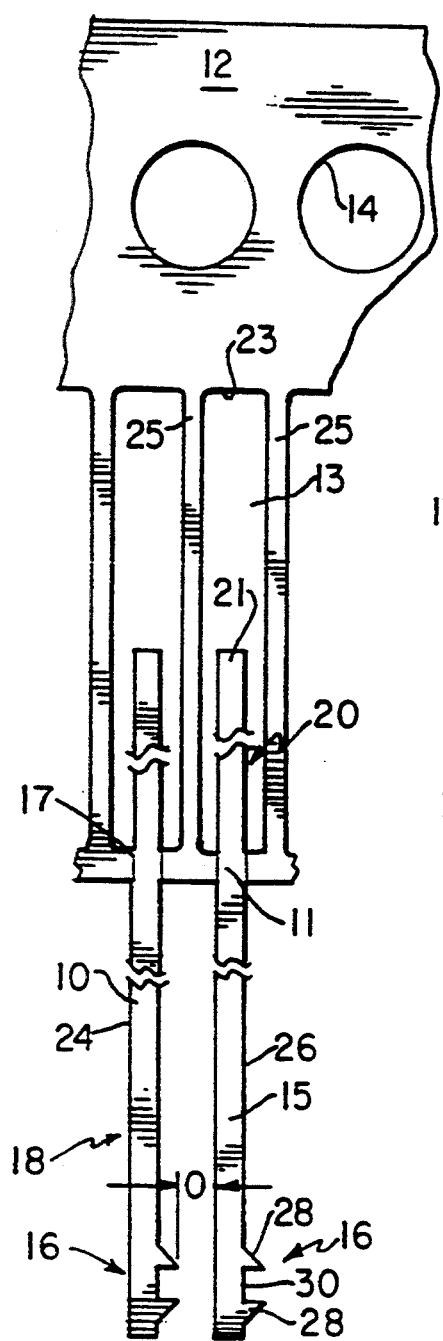
FIG. 1A shows a plan view of a continuous strip formed into a sequence of flat blanks for use in making one embodiment of the lead of the present invention.

Referring now to the drawings, wherein like reference numerals represent identical or corresponding parts throughout the several views, FIG. 1A illustrates a stamped strip having a sequence of side-by-side individual blanks 10 for the leads of the invention, formed by stamping from a conductive strip, such as of beryllium copper or like resilient conductive material (which may have a corrosion-inhibiting and solderability-enhancing coating of a tin-alloy). The individual blanks 10 extend from a carrier strip 12. Strip 12 is shown with sprocket holes 14 for indexing the blanks 10 step-by-step through subsequent progressive stamping steps for forming the blanks into final form.

The blanks 10 are adapted to be removed, in region 11, preferably by scoring along score lines 17, from carrier strip 12 after joining to a substrate. They are shaped to form the leads of the present invention and to receive a solder mass or slug for mounting to substrates such as printed circuit boards, chips, chip carriers or the like. The broken lines at the carrier strip 12 of FIG. 1A indicate that although only two blanks for forming leads are shown, any number of blanks can be provided side by side along carrier strip 12.

Figure 1B:
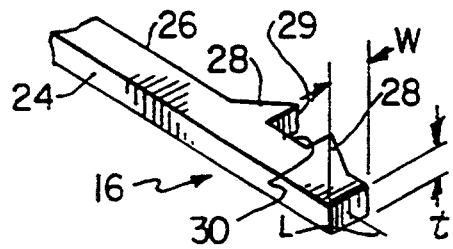
FIG. 1B shows an isometric view of an end portion of the lead of FIG. 1A.

The entire blank 10, when formed (stamped) as shown in FIG. 1A, lies in the same plane as carrier strip 12. The width w of the leads 10 is greater than their thickness t (FIG. 1B), which, as will become apparent from the discussion below, advantageously provides a reduced width portion when the leads are twisted out of the plane of the remaining portion of the blank.

Figure 2A:
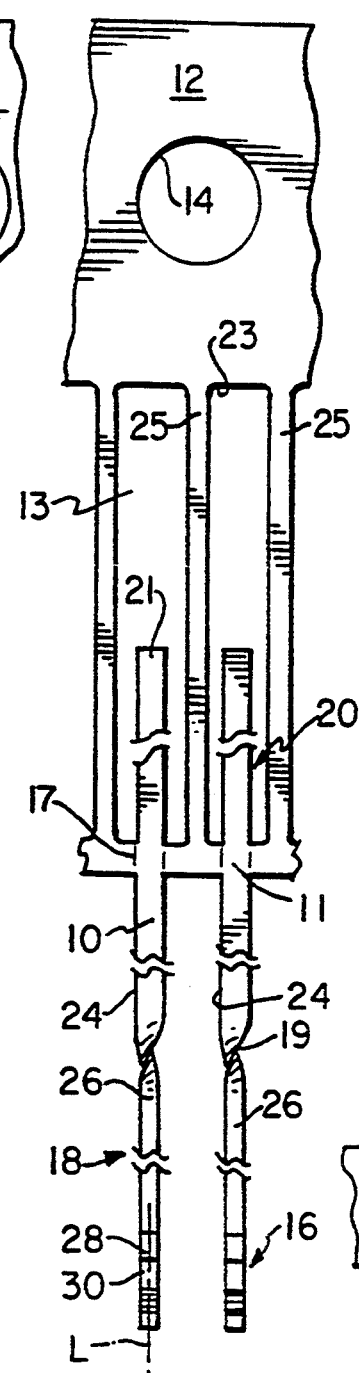
FIG. 2A shows a plan view of the leads of FIG. 1 having a twist in accordance with the present invention.

As shown in FIGS. 1A and 2A, the leads are preferably attached to the carrier strip 12 so a portion 21 extends into the space 13 between the parallel strips 25 of material, thereby reducing the length of the lead which would otherwise extend from the carrier strip 12. The lead can extend through the entire space 13 up to edge 23 of strip 12, if desired. Securement at a central region of the lead also advantageously provides sufficient rigidity during manufacturing and shaping.

The blank leads 10 are identical and each is formed of an elongated body portion 15 of sufficient length for the intended use of the lead. Body portion 15 has parallel left and right side edges 24, 26, respectively and includes a solder-bearing portion 16, a middle portion 18, and an end portion 20 attached to carrier strip 12. The designation of right and left side edges is for convenience of description only, since if the orientation of the lead is changed, the side edge references will change as well.

Lead 10 further includes a pair of extensions 28 protruding from the right side edge 26 of solder-bearing portion 16. (For clarity, all the labels do not appear on each lead.) Of course, the extensions 28 can alternatively protrude from the left side edge 24. Each protrusion 28 is preferably right-triangular shaped and is spaced apart from the matching protrusion 28 to form a gap 30 therebetween. The gap 30 is dimensioned to have a width y substantially equal to the width of a solder wire to be placed therein, as described below. Obviously, the protrusions can be other shapes beside triangular so long as they achieve the function of creating a sufficient gap for receiving the solder mass and are shaped to be able to retain the solder mass therein.

Figure 2B:
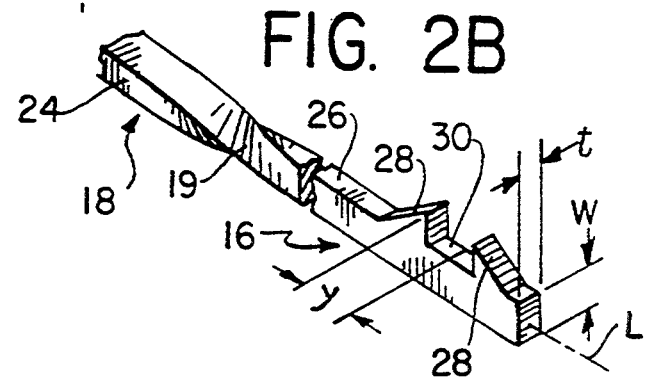
FIG. 2B shows an isometric view of an end portion of the twisted lead of FIG. 2A.

FIGS. 2A, 2B show leads 10 twisted about their longitudinal axis L at middle portion 18, and specifically at region 19, through an approximate 90 degree angle, so that the projections 28, as well as the entire solder-bearing portion 16, lie in a plane substantially perpendicular to the plane of end portion 20. The lead 10 is twisted so that the right side edge 26 is bent upward as seen in FIGS. 2A and 2B. After twisting, the solder-bearing portion 16 remains substantially aligned with the longitudinal axis L of body portion 15. By twisting the solder-bearing portion 16 which, like the remaining body portion 15, has a thickness t less than its width w, the width of the solder-bearing portion is in effect reduced since the new width, measured as the distance between the side edges, now corresponds to the thickness t (see FIG. 2B). This provides a greater spacing between leads without reducing the pitch (or number of leads per inch) along the carrier strip.

Figure 3:
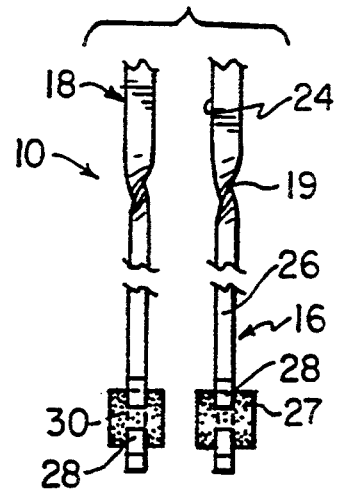
FIG. 3 shows a plan view of leads of FIG. 2A each retaining a solder mass.

As shown in FIG. 3, a solder mass 27 is placed within gap 30. One way of introducing the solder mass 27 in the gap is to place an integral solder wire (not shown) between the horizontally aligned gaps 30 of a row of leads 10 and then to cut the wire between adjacent gaps to leave a shorter, but sufficiently sized, section of solder wire therebetween. This is described in U.S. Pat. Nos. 4,597,628, and 4,728,305, both of which are herein incorporated by reference. The solder mass 27 may be flush with the outer gap of channel 30 or may extend above the channel, as disclosed in U.S. Pat. No. 4,728,305. Furthermore the tips 29 of the projections 28 may be bent inwardly into or to partially encircle the solder mass 27 to improve retention.

Figure 4:
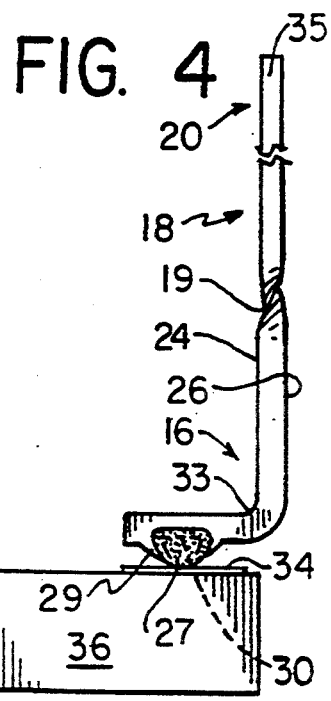
FIG. 4 shows a side sectional view of a lead as in FIG. 2 shown retaining a solder mass and bent into a configuration for surface mounting to a substrate.

In FIG. 4, the solder-bearing portion 16 of the lead 10 is bent at region 33 at an approximate right angle to the end portion 20. The solder mass 27, retained within gap 30 of solder bearing portion 16, may be placed in contact with a conductive pad 34 on a surface of a substrate 36, such as a printed circuit board, and then heated to melt the solder, to provide electrical contact between lead 10 and pad 34 on cooling. The terminal end 35 of the end portion 20 of the lead 10 may be suitably formed in any desired one of a number of ways for connection to other equipment, such as being formed as a pin for insertion into a contact receptacle, or as a wire-wrap post termination.

FIG. 5 shows a modified form of a stamped strip 12 carrying a sequence of blanks for forming leads 101. In this embodiment, each lead blank 101 is provided with two sets of projection pairs 128, 128' extending from the right side edge 126 of the body portion 115. Extensions 128' are identical to extensions 128 and each pair are spaced apart to form a gap 130, 130' therebetween, similar to gap 30, to receive solder mass 27.

The end portion 120 includes an extended portion 121 extending beyond the score lines 17 for formation of fingers discussed below.

As shown in FIGS. 6 and 7, each lead 101 includes a twisted portion 119 in its middle portion 118, so that extensions 128, 128', as well as the entire solder-bearing portion 116, lie in a plane substantially perpendicular to the plane of the end portion 120. Solder mass 27 is retained within gaps 130, 130', as in FIG. 3, and lead 101 can be used for electrical connection with planar conductive areas on a substrate. As shown in FIG. 8, lead 101 is arranged as a clip for mounting a substrate. The solder-bearing portion 116 of lead 101 is bent at 48, 50 and 52, (forward of twist 119), into a substantially reverse S-shaped configuration to form a channel 54 between the solder retaining projections 128, 128'. Substrate 36, having conductive pads 34 on its opposing surfaces, may be retained within channel 54 for soldering to lead 101. Alternately, a conductive pad may be omitted or an insulating pad can be provided instead of one of the conductive pads 34 if connection to only one of the surfaces of the substrate is desired. Extended portion 121 of end portion 120 is bent to form a finger extending in the direction away from the channel 54 and is suitably formed to be connected to other equipment.

In an alternate arrangement of lead 101, illustrated in FIG. 9, the finger which is formed from extension 121 of end portion 120, is hook-shaped and extends in the same direction as channel 54. Like the finger of FIG. 8, it is adapted to be connected to other equipment. In the embodiment of FIG. 9, substrate 34 is shown having only one conductive pad 34 which abuts solder mass 27 placed in gap 130' between projections 128'. A non-conductor 56 may replace one of the solder masses where it is desired to insulate the lead from one surface (e.g. the lower surface) of the substrate. This type of mounting is used when it is desired to make electrical contact with only one surface of the substrate. Of course, if desired, two conductive pads can be provided as in the arrangement of FIG. 8.

FIG. 10 shows a fragmentary portion of a modified stamped blank carrying a sequence of blanks for forming leads. In this embodiment, each lead blank 201 is provided with three pairs of projections 228, 228', 228", extending from the right side edge 226 of blank 201. The projections 228, 228', 228" of each pair are spaced apart from one another, so that each pair forms a gap 230, 230', 230", respectively, therebetween to receive a solder mass 27. FIG. 11 shows the lead 201 twisted in region 219 of its middle portion 218 so that all of the projections 228, 228', 228" (and the entire solder-bearing portion 216) lie in a plane substantially perpendicular to the plane of the end portion 220 of the lead 201. Solder mass 27 is shown retained in each gap.

FIG. 12 illustrates one arrangement of the triple-projection lead 201 of FIG. 11, showing an example of its many uses. The solder bearing portion 216 of lead 201 is bent at regions 248, 250 and 252 into a substantially reverse S-shaped configuration. Gaps 230, 230' face one another to form a channel 254 which may receive a substrate 36 therebetween and gap 230" is adapted for receiving a solder mass for surface mounting a substrate. Extended portion 221 of end portion 220 may form an additional terminal, or be removed if desired.

Figure 13:
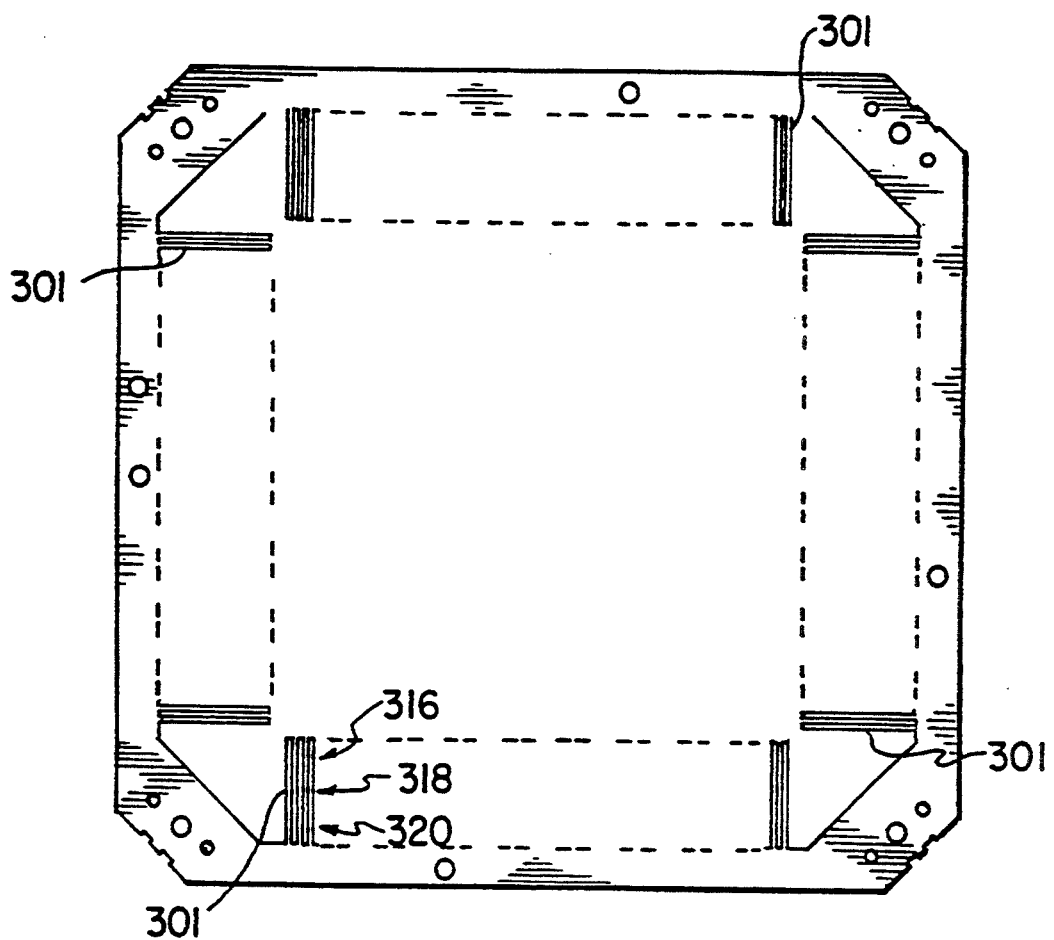
FIG. 13 shows a top plan view of a rectangular-shaped frame of leads according to the present invention for surface mounting to a chip or chip carrier.

FIG. 13 illustrates a rectangular array of leads 301, (the dotted lines indicating a continuous row of solder bearing leads not separately depicted), each having the twist of the present invention, for surface mounting to a chip carrier or other substrate having conductive pads or elements in a cooperating rectangular array. This arrangement thus allows easy simultaneous mounting of multiple leads to such a substrate. Each of the leads 301 has a construction as in FIG. 2B, with a pair of projections extending from solder bearing portion 316 and twisted in middle portion 318 so that the projections lie in a plane perpendicular to the plane of end portion 320. A solder mass is inserted into each gap formed between each pair of the projections and is heated and then cooled to provide good electrical contact between the leads and conductive pads or elements of the substrate.

As can be seen in all the foregoing embodiments of the lead, a reduction in pitch and spacing of the leads can be achieved in manufacture. That is, since the projections extend from only one side edge of the lead, closer side-by-side arrangement (see distance D in FIG. 1A) of the leads can be obtained in manufacture of the blanks.

Additionally, the blanks are formed so that the thickness of each lead is less than its width. Consequently when the solder-bearing portion is twisted out the plane of the remaining portion of the lead so that it lies substantially perpendicular to the plane of the end portion, a reduction in new width dimension of the solder-bearing portion is advantageously achieved. For example, in one embodiment, the width of the original blank measured from its right side edge to its left side edge may be 0.007 inch and the thickness of the blank, measured from its upper surface to its lower surface, may be 0.005 inch. Thus, when the solder-bearing portion is twisted to its perpendicular position, the new width of the solder-bearing portion, measured as the distance between its new right and left side edges, is 0.005 inch. This provides a desirable increased distance between leads without reducing their pitch. In another embodiment, the width may be 0.008 inch and the thickness may be 0.006 inch. Obviously, these dimensions are provided only by way of example, as leads with other dimensions are clearly contemplated by the present invention.

In forming the lead, the blank is stamped so that each blank has a pair of substantially parallel right and left side edges and at least one pair of projections extending from one of its side edges. A middle portion of the lead is then twisted so that the projections lie in a plane substantially perpendicular to the plane of the opposing end portion of the lead. The solder mass is placed within the gap between the pair of projections to provide electrical contact with the substrate. The lead is subsequently separated from its carrier strip.

While the above embodiments show a pair of projections (28 or 128 or 228 etc.) for retaining the solder mass, a single projection may be used which is longer than the height of the solder mass, and bent over a portion of the solder mass to hold it in place. This single projection construction can be used in any of the lead arrangements described above.

In the form of the invention illustrated in FIGS. 1A to 13, it will be seen that the solder-mass may project outwardly somewhat beyond the tips of the projections 28, as illustrated in FIG. 4. At times, on melting the solder, the liquid solder between the metallic parts being joined may cause some undesirable relative movement between the lead and the substrate conductive lead. To avoid this, it is desirable to have the lead have direct contact with the pad before melting or reflowing the solder, without the solder mass or stripe between them. One way, of course, is to assure that the solder in the channel or gap 30, 130 or 230 does not extend outwardly beyond the projections 28, 128, 228 so that the projections 28 will bear on the conductive pad 34 before melting the solder.

Another way to accomplish this desired arrangement is shown in FIGS. 14 to 19A, described below.

Figure 14:
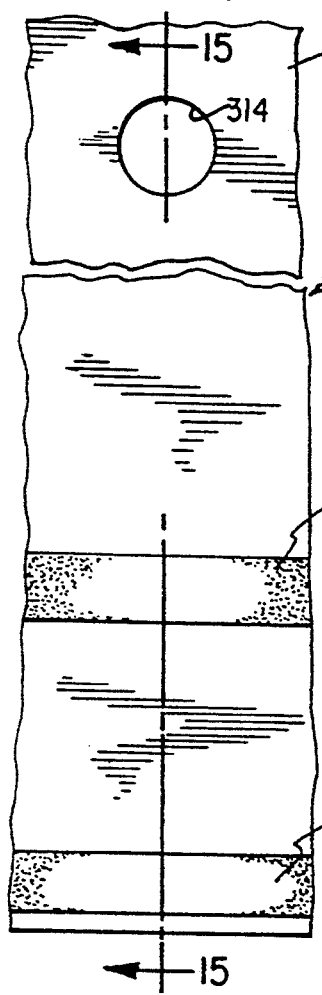
FIG. 14 shows a plan view of a section of a continuous conductive strip bearing solder stripes.
Figure 15:
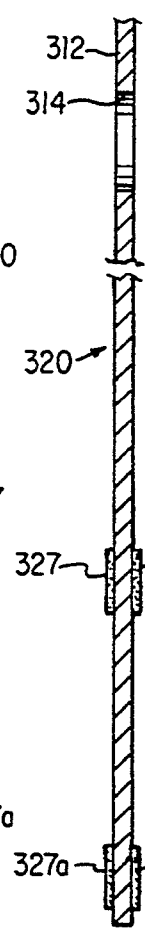
FIG. 15 shows a cross-sectional view of the strip of FIG. 14 along line 15—15 thereof.

FIGS. 14 to 19 show another solder-bearing arrangement for leads according to the invention. The reference numerals in FIGS. 14 to 19 correspond to those in the preceding figures for the same or corresponding elements, with the substitution of numeral "3" for the first digit in the previous reference numerals. FIG. 14 shows a portion of a continuous conductive strip 312 having timing or sprocket holes 314 and bearing certain solder stripes 327, 327A. Such stripes may be applied to a conductive strip 312 (such as beryllium copper) in conventional way, such as by applying molten solder to a cleaned area of the strip (or to an area covered by solder flux material) as the strip passes an outlet for the molten solder, and allowing the solder to solidify. Another way is to apply the solder strip as a ribbon mechanically impressed (e.g. cold-welded) to the strip 312. Alternatively, where the thickness of strip 312 permits, it may be skived to form a shallow channel in which a solder ribbon may be inlaid. The number of solder stripes may be selected in accordance with the intended use of the leads. For joining to a single contact pad (similar to FIG. 4) a single stripe 327 would be provided. For joining to both sides of a substrate (similar to FIG. 8) two stripes (e.g. 327, 327a) would be provided. For an arrangement similar to FIG. 12, three would be provided. In addition, each stripe 327, 327a, etc. is desirably provided on both faces of conductive strip 312, as seen in FIG. 15, although in some instances the stripes 327, 327a etc. may be placed on only one face of the continuous strip 312.

Figure 16:
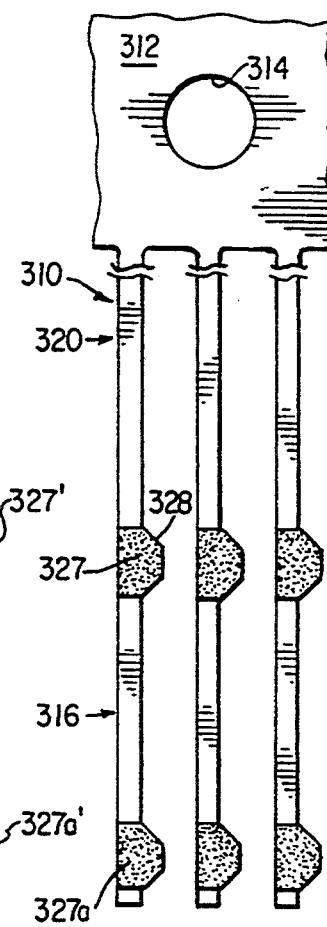
FIG. 16 is a plan view of the strip of FIG. 14, partially stamped out to form a set of lead blanks, and generally corresponding to FIG. 5.

FIG. 16 shows the strip 312 after stamping but before final forming of the lead 1. FIG. 16 omits the channels or gaps 30 from projections 328, which are preferably provided with flat faces as shown, for good contact to the substrate conductive pads 334, as seen in FIG. 18. However, the projections 328 may be rounded or even eliminated, where desirable.

Instead of holding the solder in a gap 30 as in the previous forms of the invention, after stamping the solder stripes 327 remain on the lead body 310, covering all or most of the face of projections 328. As indicated above, the solder stripes 327 may be provided on one or both faces of each lead 310.

Figure 17:
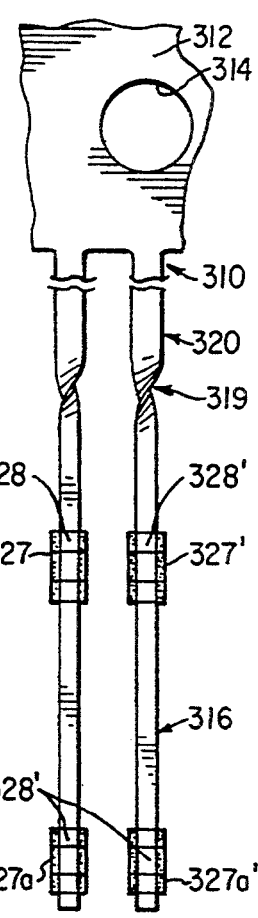
FIG. 17 is a plan view of the blank of FIG. 16, after twisting the lower ends of the lead blanks corresponding to FIG. 6.

The form of the invention shown in FIGS. 13 to 19 has the beneficial feature that the solder 327 which was on the faces of the strip 312, is caused to be on the sides of the lead as seen in FIG. 17A. As indicated in FIGS. 17 and 17A, the body 310 of each lead is twisted at 319 so that the portion 316 extends at right angles to the portion 320. In this way, the solder stripes 327 appear on one or both sides of the lead portion 316. FIG. 18 shows how a clip-type lead formed from the blank of FIG. 16, may be applied to a substrate 336 having conductive pads 334, 335. FIGS. 19 and 19A show a cross-sectional view of the same arrangement, before and after reflow of the solder.

As seen in FIG. 18, when the lead is juxtaposed to a conductive pad 334 or 335 of a substrate 336, the projection 328 or 328' is in direct contact with a respective conductive pad. This precisely locates the lead on the conductive pad during soldering and prevents relative movement between them due to liquefying of the solder. The solder 327, 327a along the sides of the lead as seen in FIG. 19 also has an edge portion in contact with the conductive pad, so that upon liquefying the solder by heat, the solder can readily flow along the sides of the lead, to the adjacent portion of the conductive pad 334 to solder the projection 328 to the pad 334 as seen in FIG. 19A. It will be understood that some molten solder may also creep into the space between the lead and the substrate if there should be voids in that space. Where desirable, the projection 328 may be rounded, or reduced in size, placing the lead body closer to or directly on the conductive pads with a desired contact area for a better electrical connection. The projections 328 may, if desired, even be omitted (but leaving the solder on the side or sides of the leads) to provide the further advantage that the space required for the projections is eliminated, so that the leads may be more closely spaced along strip 312, as is desirable for further miniaturization. In such case, the portion 316 and the bends 348 and 350 shown in FIG. 18 are dimensioned so that the lead portions at the location of the solder mass carried thereby, will lie close against the respective conductive pads 334 and 335.

Where desirable or needed, the portion of the lead adjacent to or between the solder stripes 327 appearing in FIG. 14 may be allowed to become oxidized or may be deliberately oxidized, which would have the effect of not being wettable by and resisting or repelling molten solder. This would essentially confine the molten solder to the edge of the lead adjoining the contact pad and in the region of where the solder exists, as would be desirable. In such case the edge of the lead which has been stamped from the starting strip would not be oxidized, because of the shearing action of the stamping process, and would be in good condition for soldering, in contrast with the adjacent areas which would be oxidized to repel solder.

It will be understood that the arrangement for providing solder on a lead as shown in FIGS. 14 to 19 may be used with any of the lead shapes or arrangements of FIGS. 1 to 13, having either single or multiple soldering points, and having the solder on either one side or both sides of the twisted lead in substitution for the arrangements 28, 29, 30 or 123, 129, 130 or 228, 229, 230.

It will be apparent that the form of the invention embodied in FIGS. 14–19 has some advantages over that of FIGS. 1–3. The former avoids the need for the steps of applying the solder ribbon into the gaps 30, 130, etc., then closing the projections 28, 128, etc. around the solder, and thereafter cutting the solder ribbon to isolate the individual solder masses. Contrariwise, the solder masses on the various leads are individually separated simultaneously with stamping out the lead bodies. This affords greater simplicity in fabrication. Also, FIGS. 14–19 offer the possibility of even closer lead spacing along the master strip, by permitting reducing or eliminating the projections 28, 128, etc. Also, the lead is closely positioned on the substrate, with metal-to-metal contact with the pad, which serves better to maintain the lead in position during soldering.

Figures 20, 20A, 21A, 21B:
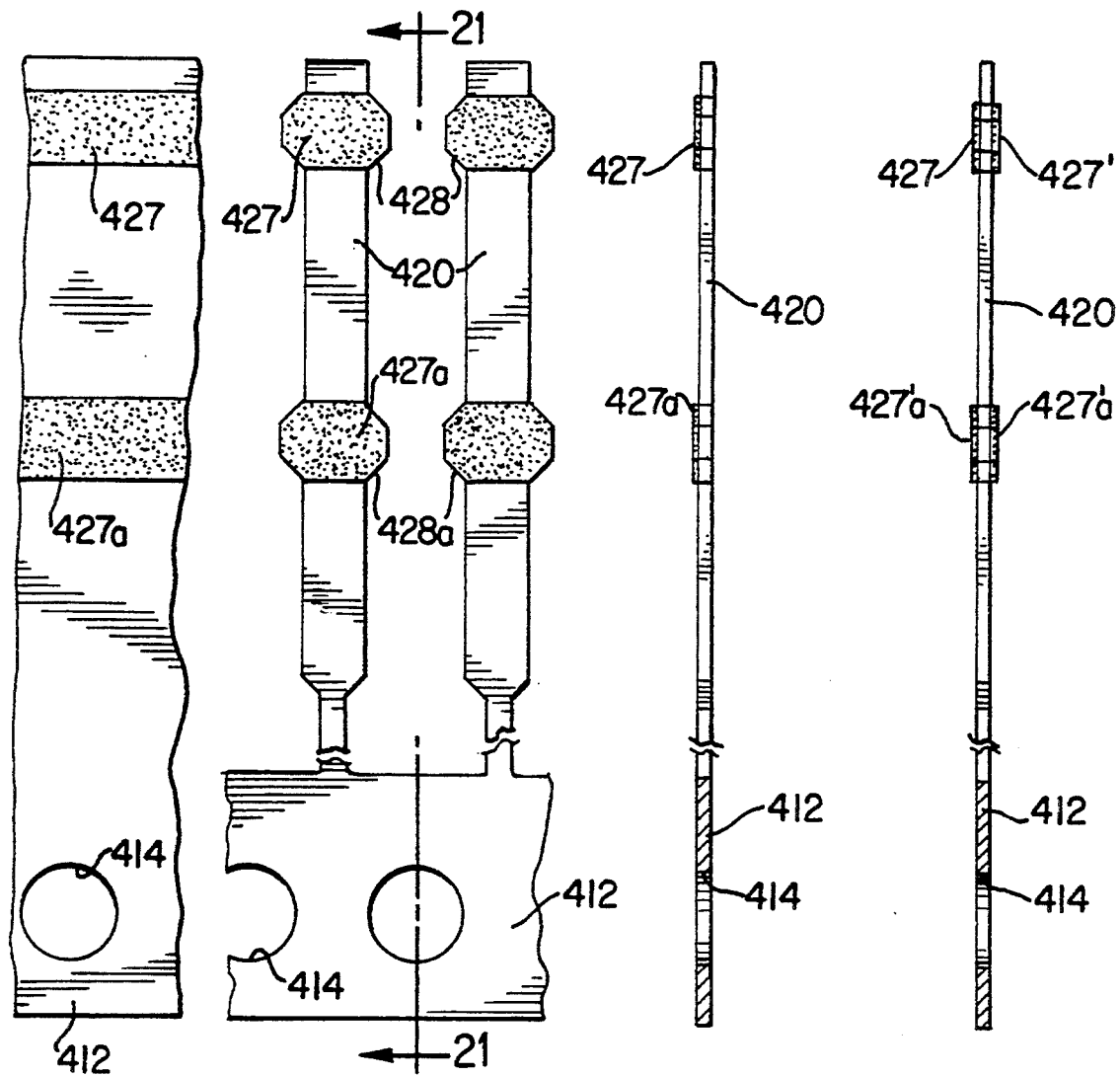
FIG. 20 is a plan view of a fragmentary strip bearing solder stripes, used in forming an alternative form of the invention.
FIG. 20A is a plan view of a fragmentary portion of the strip of FIG. 20 after partial fabrication to form separate leads.
FIG. 21A is cross-sectional view of FIG. 20A taken along line 21—21 thereof showing an edge view of a lead.
FIG. 21B is a cross-sectional view of a modified form of FIG. 20A viewed along line 21—21 thereof, having solder stripes on both faces of each lead.

The same advantage of soldering with metal-to-metal contact between lead and pad may also be obtained without the use of the twist in the lead shown in FIGS. 1–19a. This is illustrated in FIGS. 20–25. FIG. 20 shows the starting material, in the form of a long conductive strip 412 having sprocket or indexing holes 414 along one edge. Strip 412 is similar to that in FIG. 14, having a pair of solder stripes or layers 427, 427a provided as discussed above with respect to FIG. 14. Strip 412 is progressively stamped to provide a later stage shown at FIG. 20A. At that stage of stamping of the strip 412, individual leads 420 have been formed in succession along strip 412. Each lead 420 has one or more projections 428, 428a on one or both edges of the lead 420. In FIG. 21A is shown a cross-sectional view of FIG. 20A viewed along line 21—21. In this illustrative case, the lead 420 has two solder layers 427, 427a on only one face.

Figure 22:
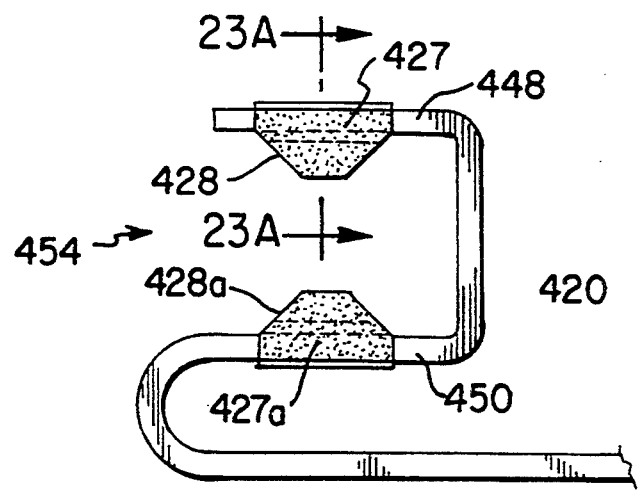
FIG. 22 is a side view of a lead portion formed from the blank of FIGS. 20A, 21A or 21B.
Figure 23A:
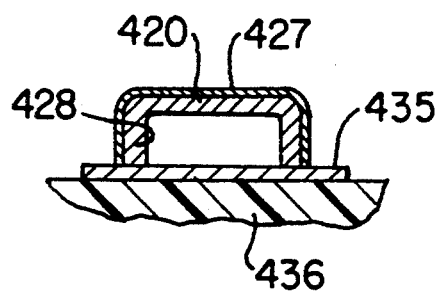
FIG. 23A is a cross-sectional view of the device of FIG. 22 viewed along line 23A—23A thereof.

By further progressive stamping the lead of FIG. 21A is bent and formed into a clip lead as shown in FIG. 22, with the projections 428 bent at right angles to the main body of the lead 420. This clip lead 420 has a gap or channel 454 for receiving a substrate therein. As in previous clip leads of the present invention, the arms 448, 450 of the clip are resilient so as to resiliently hold the substrate in place during the subsequent soldering operation. As shown in the sectional view of FIG. 23A, the lead 420 has the projections 428 bent downwardly to provide a U-shaped channel at the position of each projection 428. The solder layer 427 remains on the top and side surfaces of the lead as seen in FIG. 23A. Thus, the ends of the projections 428 are in direct mechanical and electrical contact with the conductive pad 435 on the substrate 436 to maintain the proper relative positions of the lead and the pad during the soldering operation to produce to produce a soldered joint without shifting between the lead and the pad during that operation.

Instead of having the solder stripes 427, 427a on one side of the lead 420, the solder stripes may be provided on both sides as in FIG. 21B. In such case, after forming, the clip arrangement in FIG. 22 would have a cross-section as shown in FIG. 23C with solder layers 427, 427a on the outside of the lead, and layers 427', 427a' on the inside of the lead. This arrangement provides additional solder for soldering both the inner and outer surfaces of each projection 428 to pad 435.

Figure 23B:
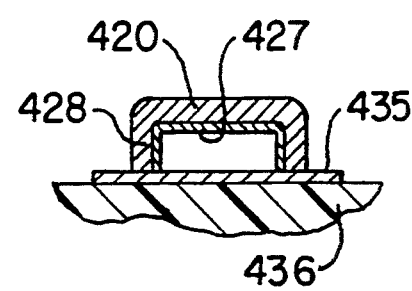
FIG. 23B is a cross-sectional view similar to FIG. 23A of one alternate form of the lead of FIG. 23A.
Figure 23C:
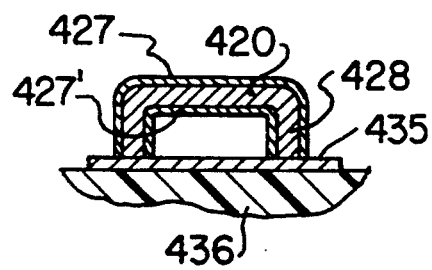
FIG. 23C is a cross-sectional view at the position of line 23A—23A of FIG. 22 of a further alternate form of the invention of FIG. 23A.
Figure 24A:
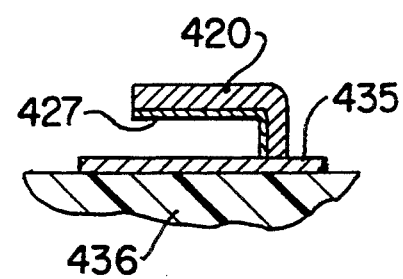
FIG. 24A to 24C are cross-sectional views of still other alternative forms of the invention taken similarly to FIGS. 23A, 23B and 23C.
Figure 24B:
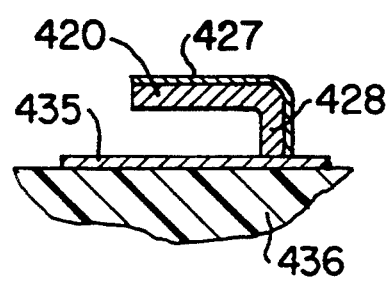
Figure 24C:
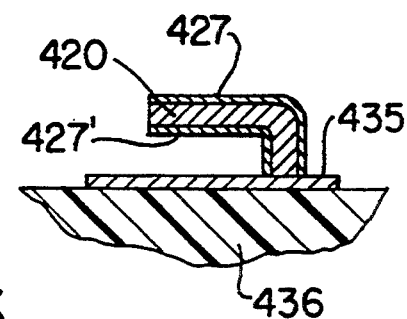

Alternatively, a solder layer may be formed on the other face of the strip 412 (or the strip may be oppositely bent) such that, after bending the projections 428, solder is on the inside of the channel formed by the projections 428, as shown in FIG. 23B, and will flow as before to join the edges of the projections 428 to the pad 435.

The projection or projections 428 may extend only from one side of the lead 420. After forming and bending, the cross-sections corresponding to FIGS. 23A to C are as show in FIGS. 24A to C, respectively.

Figure 25:
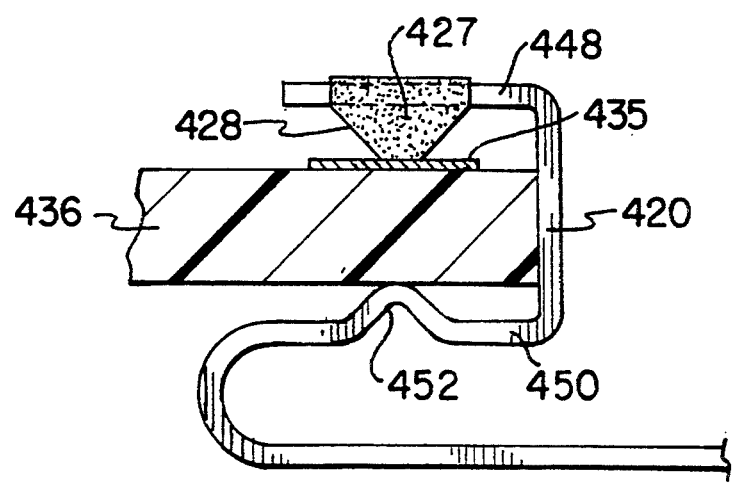
FIG. 25 is a side elevation cross-sectional view showing an alternative form of lead in relation to a substrate.

Also, only a single solder layer 427 may be used on the blank, overlying a single projection 428 on each lead. A clip in this form is shown in FIG. 25. Leg 450 of the clip may be provided with a bentout protrusion 452 to hold a substrate 436 resiliently between legs 448, 450.

While the present invention has been illustrated as applied to a clip lead, it will understood that the solder arrangements of FIGS. 20 to 23C may be also be applied to a single lead for soldering to a pad such as illustrated in FIG. 4. Thus, a lead formed in the manner of FIGS. 20–23, with but a single solder stripe, may be substitutes for the lead 18 in FIG. 4.

The major feature of these FIGS. 20 to 25 is that the solder is applied as one or more stripes to the original strip. When bending down the projections 428 (or, in the absence of such projections, when stamping out the lead bodies 420 from the original strip) with the solder on the upper face of the lead, by proper adjustment of the stamping dies, it may be arranged that the solder also extends around the edges of the lead body 420 or projection 428. This increases the amount of solder used in joining the lead to the conductive pad, and assists the flow of solder at the junction of the lead and pad.

Figure 26:
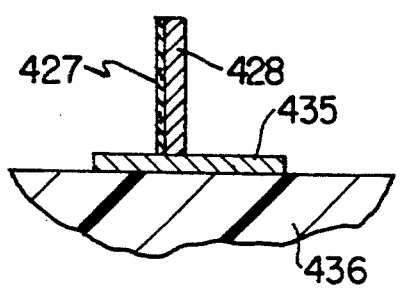
FIG. 26 is a fragmentary elevation cross-sectional view of another modification of the previous leads viewed along line 26—26 of FIG. 26A.
Figure 26A:
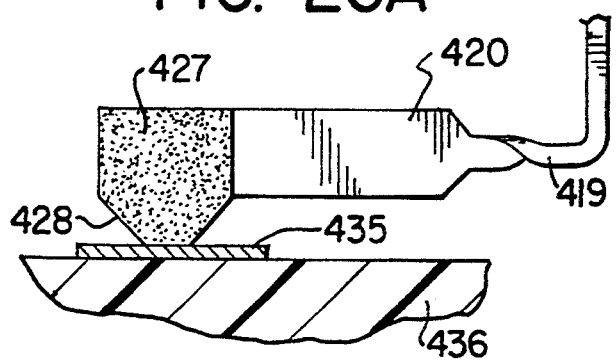
FIG. 26A is a side elevation view of the lead of FIG. 26.

FIGS. 26 and 26A show another form of the present invention in which the lead body 420 is provided with only a single lateral projection 428, covered on one face by a layer 427 of solder. In order to attain the advantage of metal-to-metal contact between the lead and the substrate conductive area 435, instead of bending the tab 428 at an angle relative to the body of lead 420 as in FIG. 22, in this instance the entire lead body 420 is twisted as indicated at 419. The twist may be alternatively formed as at 19 in FIG. 4. In this way the lead body 420 may have its projection 428 put into direct metallic contact with the conductive area 435 of substrate 436, and held there by suitable means while the solder is flowed to electrically and mechanically connect the tab 428 to the pad 435. It will be understood that in this arrangement, either or both faces of the lead body 421 may be covered by the solder stripe 427, as desired.

Figure 27:
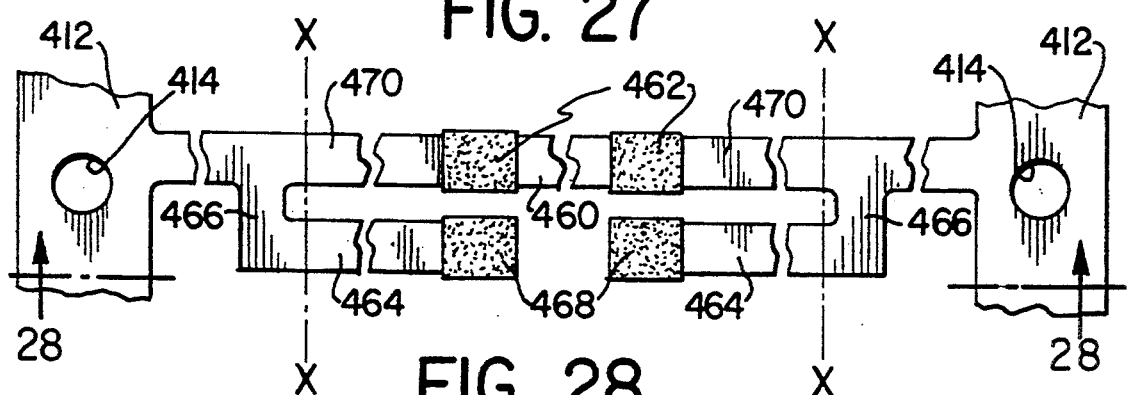
FIG. 27 is a plan view of a partially formed blank of another form of the invention, used to form a lead frame.
Figure 28:
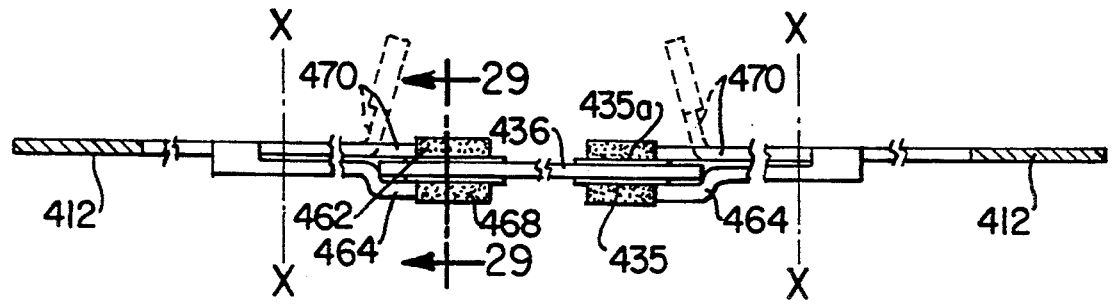
FIG. 28 is a cross-sectional elevation view of the blank of FIG. 27 after further processing.
Figure 29:
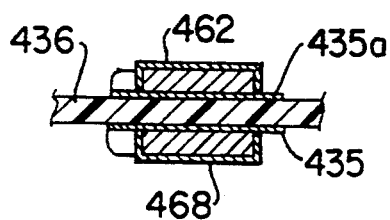
FIG. 29 is a fragmentary cross-sectional view of the device of FIG. 28 viewed along line 29—29 thereof.

FIGS. 27–29 show still another form of the present invention applied to a lead frame for soldering a set of leads to one or more rows of conductive areas 435, 435a of a substrate 436. In this instance the original conductive strip 412 (also preferably of resilient beryllium copper, which may be coated with an anti-corrosion film of a tin alloy) is formed with a pair of rows of indexing holes 414, one on each edge of the basic strip 412, forming a pair of carrier strips. A pair of solder stripes are applied parallel to the edges of the strip 412 in suitable manner. In preliminary progressive stamping operations the original strip 412 with its pair of solder stripes is formed as shown in FIG. 27, to have a sequence of cross-strips 460, only one being shown. The cross-strips 460 are arrayed in sets, each set having a number of cross-strips corresponding to the number of substrate contact pads to which the lead frame is to be attached. Each cross-strip 460 has a main section extending between the indexing portions 414 and carrying two solder layer areas 462, each being a portion of an original solder stripe. Each cross strip 460 is also formed at each end with a finger 464 parallel to the main portion of cross-strip 460 and joined to it by a connecting portion 466. Each finger 464 carries another portion of the original solder stripe as a solder layer area 468, aligned with a respective solder area 462 on the main cross strip 460.

The cross-strip 460 has its central section 460a cut away as shown in FIG. 28, leaving a lead 470 at each end joined to a respective carrier strip. The carrier strips on either edge of the main strip are retained in their same relative position notwithstanding cutting out the center section 436, by appropriate means, such as spaced strips interconnected the carrier strips, at positions between the various sets of cross-strips.

Each lead 470 is bent upward as shown in dotted lines in FIG. 28, and each finger 464 is then folded at its connecting section 466 to be in alignment with the cross-strip 460. Hence a substrate 436 may be dropped into the cradle-like lead frame configuration provided by the array of fingers 464, with the substrate contact pads 435 in substantial registry with the solder areas 468, but with each pad on the face of its finger 464 opposite to the finger face bearing the solder area 468, thereby assuring metal-to-metal contact between each substrate conductive pad and a finger 464.

After the substrate 436 has been laid into the cradle formed by the fingers 464, the fingers 470 may be bent over into contact with the substrate in the position shown in solid lines in FIG. 28, to resiliently retain each substrate pad in fixed position relative to a respective solder area of a finger 464 as shown in FIG. 28. The fingers 470 in a fashion similar to fingers 464 thus have direct metal contact with the conductive areas on the upper surface of the substrate 436 as shown in FIG. 28.

In this way the substrate is held between the resilient fingers 464 and 470, and in direct metallic contact with them, with the solder area on the faces of the fingers away from the substrate.

To facilitate the soldering operation, by selection of the tolerances between the male and female portions of the dies forming the blank shown in FIG. 27, and taking advantage of the highly malleable quality of solder material, the solder stripe 462 may be smeared over the edges of the fingers 470 and 464 as shown in FIG. 29. This solder on the outside edges of each finger is closely adjacent to or indeed may be in contact with the conductive area 435 of the substrate 436. Accordingly, when the solder is heated to its melting point, the solder on the edges of each finger readily flows into contact with its respective conductive area 436 and acts as a wick to draw the solder on the outer finger face to the junction of the substrate conductive area and the finger, to form a good soldered joint when solidified.

After soldering is completed, the carrier strips and the connecting portions 466 joining the fingers 464, 470 are cut away (such as at or near the dash/dot line X—X on FIG. 27), leaving each finger soldered to and forming a lead for a respective conductive area of the substrate.

The arrangements of the leads of the present invention described above will be understood to be by way of example only, since numerous other arrangements are possible, depending on the desired mounting of the substrates. Moreover, an additional number of projections other than the number shown in the above examples could be provided.

It will be understood that the solder-retaining arrangement of the present invention is suitable for many other applications, where it will have the advantages discussed above as well as others. Accordingly, the above embodiments are to be deemed illustrative only, and, within the scope of the appended claims, the present invention may be practiced otherwise than as specifically described herein.

What is claimed is:

1. A blank for leads for connection to electrical apparatus, comprising
    an elongated strip of electrically conductive material, one longitudinally extending portion of,
    said strip constituting a carrier portion, said strip also including a series of parallel supporting strips integral with and extending laterally from said carrier portion, and a lead body parallel to and between each pair of consecutive supporting strips, each lead body being supported from the ends of its adjacent supporting strips by severable joins at respective points of said lead body spaced from both ends of said lead body, so that one portion of said lead body is between said supporting strips and another portion is not.

2. A blank as in claim 1, wherein said other portion of each said lead body is twisted about its longitudinal axis with respect to said one lead body portion into a plane substantially perpendicular to that of said one portion of said lead body.

3. A blank as in claim 2, wherein the thickness of each said lead body portion is less than its width, whereby the separation between two adjacent ones of said twisted portions is greater than the separation between said one body portions.

4. A blank as in claim 3, wherein said twisted body portion has a configuration thereon adapted to retain a solder.

5. A solderable lead for connection to a device having a conductive area, comprising:

an elongated body of electrically conductive sheet material, said body having a contacting portion extending only along a discrete portion of said body and formed by an edge of said body for contacting said conductive area of said device with a metal-to-metal contact, said body having a surface contiguous to said contacting portion;

said contiguous portion being formed by a projection bent at an angle to said body and said contacting portion being constituted by an edge of said projection, a layer of solder on said latter contiguous surface and extending immediately adjacent to said contacting edge portion such that upon heating, said layer of solder will liquefy and migrate to form a soldered joint between said edge contacting portion and said conductive area.

6. A lead as in claim 5 wherein said solder also overlies said body adjacent said projection.

7. A solderable lead according to claim 5, wherein said solder layer covers a surface of said body angularly disposed to said contacting portion.

8. A method of joining a lead frame to a substrate having a row of conductive areas on at least one surface thereof, comprising the steps of producing from a flat elongated strip of conductive material a blank having a carrier strip portion extending along one edge of said elongated strip and a plurality of leads extending laterally from said carrier portion, each lead comprising a first finger for connection to a substrate conductive area and a second finger for retaining a substrate between it and said first finger, said fingers being co-planar and spaced from one another along said carrier strip, each of said fingers having a first face and a second face, providing a layer of solder on a first face of each of said fingers, said solder layers being aligned in the direction of the length of said elongated strip, bending said first finger of each lead to have a portion in a plane at an angle to that of the second finger of such lead, folding the second finger of each lead to be opposite said first finger of the same lead with the second faces of said fingers of each lead facing one another, placing a substrate on the second faces of said second fingers with a conductive area of said substrate in direct metallic contact with a respective second finger, thereafter bending said first fingers into contact with said substrate to retain the substrate resiliently between said first and second fingers.

9. A method as in claim 8 further including thereafter severing said carrier strip from both said first and second fingers.

10. A method as in claim 8 where said substrate has a further row of conductive areas on a second surface of said substrate, and said bending of said first fingers toward said substrate places said second fingers in direct metal contact with respective ones of said further row of conductive areas.

11. A method as in claim 8 further comprising providing said elongated strip of conductive material with a stripe of solder extending along the length thereof, forming said fingers by stamping them from said strip, with each finger having a portion of said solder stripe thereon, and simultaneously causing solder from said stripe to extend around and in contact with at least one edge of at least one finger, whereby upon placing a substrate conductive area in direct contact with a finger the solder on said edge is juxtaposed to said area.

12. A method of forming a solderable lead arrangement comprising the steps of:

providing an elongated flat strip of conductive material having thereon a band of solder extending along its length, forming therefrom a series of parallel transverse leads each joined at one end to a carrier strip, each of said leads having an elongated body and a lateral projection on one edge of said lead body at the location of said solder band, and causing said projections to be at an angle to a portion of said bodies, whereby said projections may be placed with an edge in direct metal-to-metal contact with substrate conductive areas and soldered thereto without shifting due to melting of solder.

13. A method as in claim 12 further including:

forming at least certain of said leads in the form of a U-shaped clip, with said projections formed on facing arms of said clip and extending toward one another, said projections being spaced by a gap correlated to the thickness of a substrate to be inserted in and resiliently retained by said clip, each of said projections extending from said lead body by a distance at least as great as the thickness of said solder band.

14. A method as in claim 12, further including:

causing said solder to extend around at least one of the side edges of said projections.

15. A method as in claim 14 in which said solder is on the inside of the angle between said projection and said body.

16. A method as in claim 14 wherein said solder is on the outside of the angle between said projection and said body.

17. A method as in claim 16 in which said solder is on the inside of the angle between said projection and said body.

18. The method of forming a lead soldered to a conductive area of a substrate, comprising:

forming a conductive lead having a flat body portion, and a flat projection at one edge of said body portion and extending along only a discrete portion of the length of said lead, a layer of solder on at least one face of said projection, placing said body substantially perpendicular to said conductive area, with an edge of said projection in metal-to-metal contact there with, and applying heat to solder said body to said area.

19. A method as in claim 18, wherein said body portion has a layer of solder on both faces thereof.

20. A method as in claim 18, wherein said body portion has a second projection at its other edge and opposite said first projection, said solder layer extending over both said projections and the body portion therebetween.

21. A method as in claim 20 also comprising bending said projections at an angle to said body to form a channel.

22. A method as in claim 21 where said solder is on the outside of said channel.

23. A method as in claim 21 where said solder is on the inside of said channel.

24. A method as in claim 22 where said solder is on the inside of said channel.

25. An assemblage of leads, each lead being integral with a carrier strip and said leads being spaced along said carrier strip, each lead comprising an elongated body of electrically conductive sheet material, said body having a contacting portion extending only along a discrete portion of said body and formed by an edge of said body for contacting a conductive area of a device with a metal-to-metal contact, said body having a surface contiguous to said contacting portion, a layer of solder on said latter contiguous surface and extending immediately adjacent to said contacting edge portion such that upon heating, said layer of solder will liquefy and migrate to form a soldered joint between said edge contacting portion and said conductive area.

26. A lead for soldering to a conductive surface comprising:

an elongated flat body including a first portion having at least one solder element thereon, and a terminal portion, a region of said first body portion lying in a plane substantially perpendicular to the plane of said terminal portion, at least one face of said first body portion having said solder element thereon, said solder element being formed as a solder layer on a face of the first lead body portion.

27. A lead as in claim 26 having solder on each of two opposed faces of said first body portion.

28. A lead as in claim 26 wherein said first body portion includes at least one projection extending from a first edge of said body, and said solder is positioned on a face of said projection and on an adjoining area of said first body portion.

29. A lead for soldering to a conductive surface comprising:

an elongated flat body including a first portion having at least one solder element thereon, and a terminal portion, a region of said first body portion lying in a plane substantially perpendicular to the plane of said terminal portion, at least one face of said first body portion having said solder element thereon, said first body portion including at least one projection from an edge of said body portion, and said solder being formed as a layer on both faces of said projection and on said first body portion.

30. A method of forming a series of leads for soldering to a corresponding series of contact pads on a substrate comprising the steps of providing a continuous strip of conductive material, stamping said strip progressively to form a succession of flat elongated lead blanks, each lead blank having first and second portions, twisting one of said portions of each said lead blank relative to another portion so that said one portion is in a plane substantially perpendicular to the plane of the other portion of said lead blank, and applying solder to said one portion.

31. A method as in claim 30, including the step of applying a solder strip along said conductive strip before said stamping step.

32. A method as in claim 30 wherein the orientation of said one portion is changed by twisting and said solder is affixed to said first portion before said twisting.

33. A method as in claim 30 wherein said one portion is changed by twisting and said solder is affixed to said first portion after said twisting.

34. A method as in claim 30 wherein said solder is affixed to said strip before forming said lead blanks.

35. A method as in claim 30 also including forming on each lead blank at least one projection extending laterally from a first edge of said one blank portion and applying said solder on said projection.

36. A method of forming a lead joined to a conductive surface, comprising providing an elongated flat strip of conductive material having thereon a band of solder extending along its length, forming therefrom a series of parallel transverse leads each joined at a terminal end to a carrier strip, each of said leads having an elongated body and a lateral projection on at least one edge of said lead body at the location of said solder band, placing said lead with its edge in metal-to-metal contact with said conductive surface, and reflowing said solder, whereby said lead may be soldered to said conductive surface without being liable to shift due to melting of solder.

* * * * *